US00RE36475E

United States Patent [19]

Choi

[11] E Patent Number: Re. 36,475

[45] Reissued Date of Patent: Dec. 28, 1999

[54] METHOD OF FORMING A VIA PLUG IN A SEMICONDUCTOR DEVICE

[75] Inventor: Kyeon K. Choi, Suwon-Shi, Rep. of Korea

[73] Assignee: Hyundai Electronics Industries Co., Ltd., Rep. of Korea

[21] Appl. No.: 08/734,784

[22] Filed: Oct. 15, 1996

Related U.S. Patent Documents

Reissue of:

[64] Patent No.: 5,409,861
Issued: Apr. 25, 1995
Appl. No.: 08/305,306
Filed: Sep. 15, 1994

[30] Foreign Application Priority Data

Sep. 15, 1993 [KR] Rep. of Korea ..... 93-18525

[51] Int. Cl.[6] ..... H01L 21/4763

[52] U.S. Cl. ..... 438/628; 438/629; 438/644; 438/675

[58] Field of Search ..... 438/618, 628, 438/629, 637, 638, 639, 640, 644, 675

[56] References Cited

U.S. PATENT DOCUMENTS

| | | | |
|---|---|---|---|
| 5,198,389 | 3/1993 | Van der Putten | 437/190 |
| 5,232,872 | 8/1993 | Ohba | 437/192 |
| 5,270,256 | 12/1993 | Bost et al. | 438/639 |
| 5,320,979 | 6/1994 | Hashimoto et al. | 437/192 |

FOREIGN PATENT DOCUMENTS

| | | | |
|---|---|---|---|
| 0168828 A2 | 1/1986 | European Pat. Off. . | |
| 0255911 A2 | 2/1986 | European Pat. Off. . | |
| 0 216 017 | 4/1987 | European Pat. Off. . | |
| 0300414 A1 | 1/1989 | European Pat. Off. . | |
| 0168828 B1 | 1/1992 | European Pat. Off. . | |
| 0 500 456 | 8/1992 | European Pat. Off. . | |
| 0064927 | 4/1982 | Japan | 437/203 |
| 0 061323 | 3/1987 | Japan . | |
| 0061323 | 3/1987 | Japan | 437/203 |
| 62-061323 | 3/1987 | Japan . | |
| 4 056 237 | 2/1992 | Japan . | |
| 4-216 548 | 8/1992 | Japan . | |
| 5 259 110 | 10/1993 | Japan . | |
| 2 135 123 | 8/1984 | United Kingdom . | |
| 2 253 938 | 9/1992 | United Kingdom . | |

OTHER PUBLICATIONS

Patent Abstracts of Japan, vol. 011, No. 249, Aug. 13, 1987.

Panabiere et al., "Concept and Processing of Buring Photomasks", Revue de Physique Applique, vol. 25, No. 8, pp. 859–865, Aug. 1, 1990.

*Primary Examiner*—Tuan H. Nguyen

*Attorney, Agent, or Firm*—Townsend and Townsend and Crew LLP; Richard T. Ogawa; Ramin Aghevli

[57] ABSTRACT

A method of forming a via plug in a semiconductor device is disclosed. Metal nuclei are formed on the surface of the metal layer underlying the via hole. The metal layer, which is partially exposed between metal nuclei, is etched by means of a wet etching method, and accordingly, a plurality of etching grooves is formed on the partially exposed surface of the metal layer. As a result, the formation of such grooves has the effect of increasing the bottom surface area of the via hall, thereby increasing the adhesive strength to a contact surface of the via hall and decreasing the via resistance.

159 Claims, 2 Drawing Sheets

METHOD OF FORMING A VIA PLUG IN A SEMICONDUCTOR DEVICE

Matter enclosed in heavy brackets [ ] appears in the original patent but forms no part of this reissue specification; matter printed in italics indicates the additions made by reissue.

FIELD OF THE INVENTION

The invention relates to a method of forming a via plug in a semiconductor device, more particularly, it relates to a method of forming a via plug by forming metal nuclei on the surface of a metal layer underlying a via hall and then etching the metal layer exposed between the metal nuclei by the wet etching method so that a plurality of etching grooves are formed thereupon. The formation of such grooves has the effect of increasing the bottom surface area of the via hall, thereby increasing the adhesive strength to a contact surface of the via hall and decreasing the via resistance.

INFORMATION DISCLOSURE STATEMENT

Generally, as integration of a semiconductor device is increased, the size of the via hall diminishes while the aspect ratio increases. If the depth of the via halls are different from each other, the via plug is formed on the via halls using tungsten. In order to form a uniform and complete via plug, pretreatment of the via halls is important. If the surface of the via halls is not uniform prior to and during application of the wet etching process, particles, such as a native oxide layer and polymer, are generated on the surface of the metal layer underlying the via halls. Accordingly, when the via plug is formed on the via halls, the tungsten is deposited with a luck of uniformity resulting in increased via resistance to; such increased resistance has a deleterious effect on subsequent processes culminating in the lowering of the electrical connecting characteristic of the semiconductor device.

Therefore, it is an object of the invention to provide a method of forming a via plug in a semiconductor device by which a fluorine particle and a native oxide layer formed on the surface of the metal layer underlying a via hole are removed and metal nuclei are formed on the surface of the metal layer. The metal layer between the metal nuclei is then exposed and etched by the wet etching method so as to increase the surface area of the adhesive contact area, thereby decreasing the via resistance while increasing the adhesive strength.

SUMMARY OF THE INVENTION

A method of forming a via plug according to the present invention in order to achieve the above object is comprised of the following steps:

A first metal layer is formed on a substrate and first, second and third insulating layers are sequentially deposited on the resulting substrate; the third insulating layer is then planarized;

A desired portion of the third, second and first insulating layer are etched using a contact mask until the first metal layer is exposed, thereby forming a via hole;

The via hole is pretreated by the dry etching method and then metal is selectively deposited on the surface of the first metal layer underlying the via hole using a metal depositing reactor, thereby forming metal nuclei;

The first metal layer exposed between the metal nuclei is etched so that a plurality of etching grooves is formed on the first metal layer.

BRIEF DESCRIPTION OF THE DRAWINGS

For fuller understanding of the nature and objects of the invention, reference should be made to the following detailed description taken in conjunction with the accompanying drawings in which.

Similar reference characters refer to similar parts throughout the several views of the drawings.

DETAILED DESCRIPTION OF THE INVENTION

FIGS. 1A through 1E are cross sectional views illustrating steps forming a via hole in a semiconductor device according to the present invention.

Figure 1A:
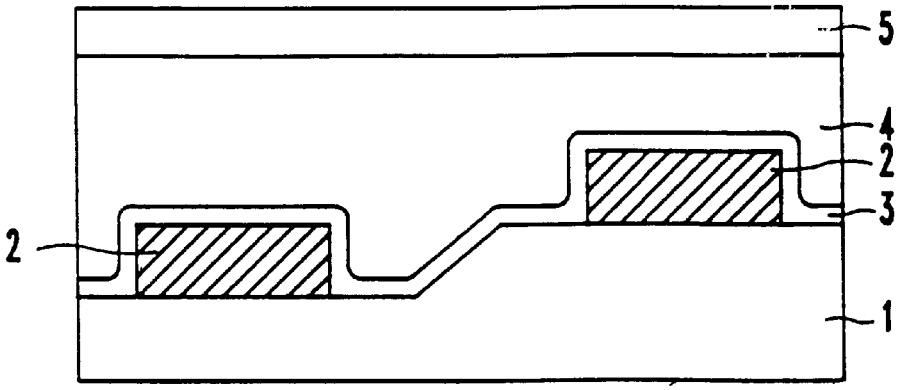
FIGS. 1A through 1E are cross sectional views illustrating steps forming a via hole in a semiconductor device according to the present invention.

Referring to FIG. 1A, a first metal layers 2 are initially formed on the substrate 1 in such a way so as to be isolated from each other. The first, second and third insulating layers 3, 4 and 5 are sequentially formed on the resulting substrate and then the third insulating layer 5 is planarized.

Figure 1B:
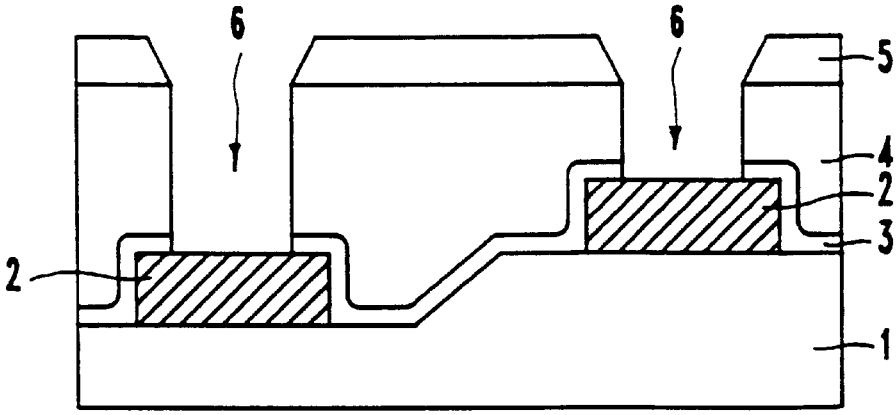

Referring to FIG. 1B, a desired portion of the first, second and third insulating layers 3, 4 and 5 situated on top of the first metal layers 2 are sequentially etched using the wet etching or dry etching method in order to connect to a second metal layer which will be formed in a later process, and thereby forming via holes 6 the aspect ratios of which are different from each other.

Figure 1C:
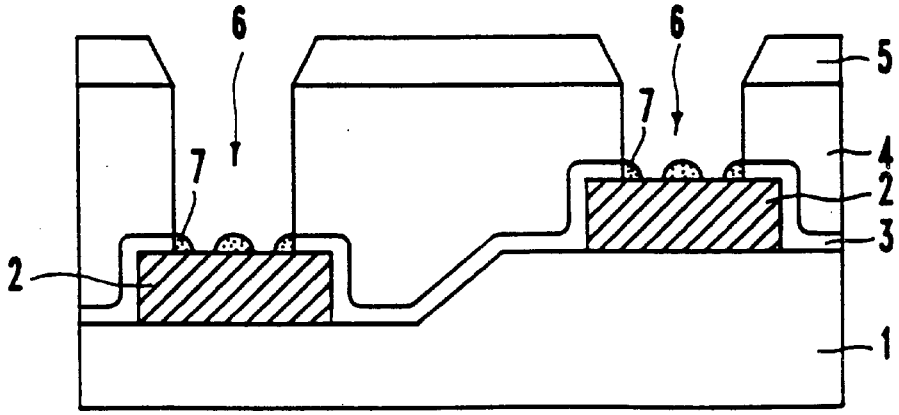

Referring to FIG. 1C, the via holes 6 are pretreated by the dry etching method in the RIE (Reactive Ion Etch) reactor during approximately one (1) minute using a $NF_3$, $SF_6$ or Ar sputter. Metal such as a tungsten(W), aluminum(Al), copper (Cu), molybdenum(Mo), titanium(Ti), cobalt(Co), or chromium(Cr) is then selectively deposited on the surface of the first metal layer 2 underlying the via holes 6 for a duration of approximately one (1) minute in the metal depositing reactor, thereby forming metal nuclei 7. The magnitude of the metal nuclei diameter is approximately 500 to 1000 Å. When the via holes 6 are pretreated, a fluorine particle compound and a native oxide layer is generated.

Figure 1D:
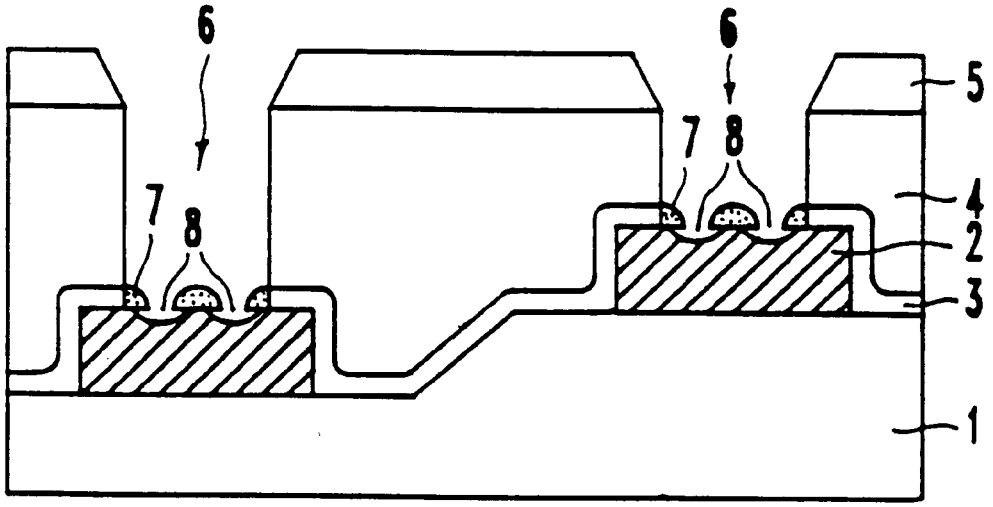

Referring to FIG. 1D, the first metal layer partially exposed between the metal nuclei 7 is etched by the wet etchant such as BOE (Buffered Oxide Etchant) in such a way that the metal nuclei 7 remains, and thereby forming a plurality of etching grooves 8 on the surface of the first metal layer 2. The wet etchant's etching selectivity is greater for the first metal layer 2 than it is for the metal nuclei 7.

As the wet etching method forms etching grooves 8 on the surface of the partially exposed metal layer, the contact area is increased and a fluorine particle compound, and native oxide layer are removed. As a result, when the via plug is formed on the via hole, the adhesive strength is increased while the via resistance is decreased.

Figure 1E:
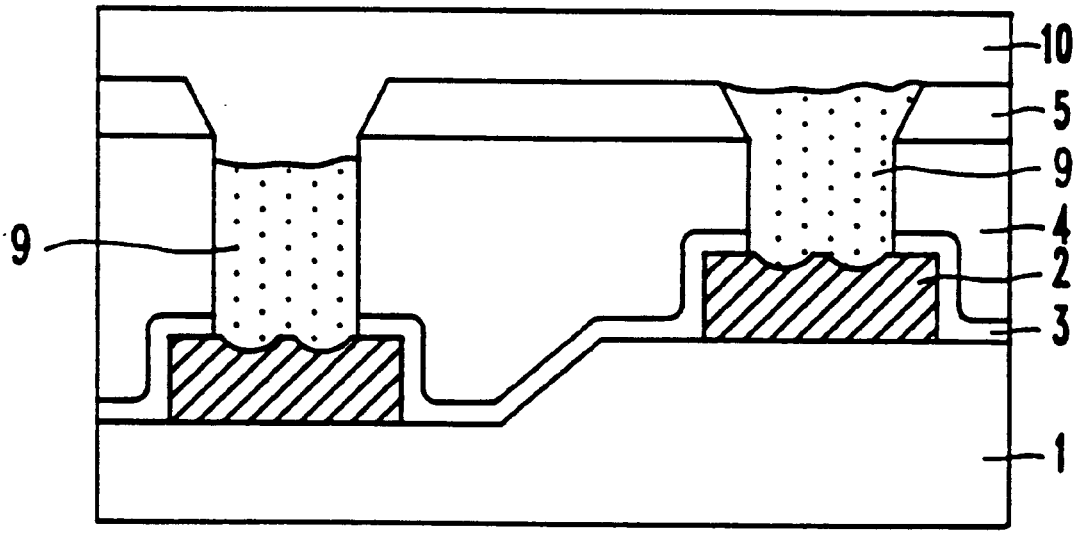

Referring to FIG. 1E, a via plug 9 is formed on the via holes 6 using a LPCVD reactor, and then a second metal layer 10 is formed to connect with the via plug 9.

As described above, according to the present invention, metal nuclei are formed on the via hole and then etching grooves are formed on the partially exposed metal layer under the via hole to increase the area of contact for connection with the via plug. Accordingly, the removal of particles which contribute to the increased via resistance results in a decrease of via resistance and improves the adhesive strength thereof. As a result, the electrical connection characteristic of the semiconductor device is improved.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of forming a via plug in a semiconductor device comprises;

forming a first metal layer on a substrate and sequentially depositing a first, second and third insulating layer on the resulting substrate and then planarizing said third insulating layer;

etching a desired portion of said third, second and first insulating layer using a contact mask until said first metal layer is exposed, thereby forming a via hole;

pretreating said via hole by the dry etching method and then, forming metal nuclei on the surface of said first metal layer at the bottom of said via hole;

etching said first metal layer exposed between said metal nuclei so that a plurality of etching grooves is formed on said first metal layer; and forming a via plug on said via hole.

2. The method of claim 1, wherein said first metal layer exposed between said metal nuclei is etched by [the] *a* wet etchant which [the] *an* etching selectivity of said first metal layer is greater than said that of said metal nuclei.

3. The method of claim 1, wherein said via plug is formed in [the] *an* LPCVD reactor.

4. The method of claim 1, wherein [the] *a* magnitude of each nuclei is 500 to 1000 Å.

5. The method of claim 1, wherein said via hole is pretreated in [the] *a* RIE reactor.

6. The method of claim 1, wherein said via hole is pretreated by a $NF_3$, $SF_6$ or Ar sputter.

7. The method of claim 1, wherein said etching grooves are formed using [the] *a* buffered oxide etchant.

8. The method of claim 1, wherein said metal nuclei are formed by tungsten.

9. The method of claim 1, wherein said metal nuclei are formed by aluminum.

10. The method of claim 1, wherein said metal nuclei are formed by copper.

11. The method of claim 1, wherein said metal nuclei are formed by molybdenum.

12. The method of claim 1, wherein said metal nuclei are formed by titanium.

13. The method of claim 1, wherein said metal nuclei are formed by cobalt.

14. The method of claim 1, wherein said metal nuclei are formed by chromium.

*15. A method of forming a via plug in a semiconductor device comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming metal nuclei and a plurality of grooves adjacent to said metal nuclei on said conductive layer within said exposed portion of said conductive layer to increase surface area of said conductive layer, wherein said plurality of grooves are formed by a buffered oxide etching process; and*

*forming a plug layer overlying said exposed portion in said via structure.*

*16. The method of claim 15, further comprising pretreating said exposed portion of said conductive layer by an etching method.*

*17. The method of claim 15, wherein said metal nuclei are formed by a process including deposition.*

*18. The method of claim 15, wherein said insulating layer comprises a first insulating layer overlying said conductive layer and a second insulating layer overlying said first insulating layer.*

*19. The method of claim 15, wherein said insulating layer comprises a first insulating layer overlying said conductive layer, a second insulating layer overlying said first insulating layer, and a third insulating layer overlying said second insulating layer.*

*20. The method of claim 19, wherein said third insulating layer is planarized.*

*21. The method of claim 15, wherein said insulating layer is planarized.*

*22. The method of claim 15, wherein said metal nuclei comprise material selected from a group consisting of tungsten, aluminum, copper, molybdenum, titanium, cobalt, and chromium.*

*23. The method of claim 15, wherein each of said metal nuclei has a magnitude of 500 to 1,000 Å.*

*24. The method of claim 15, wherein said increased surface area reduces a via resistance.*

*25. The method of claim 15, wherein said increased surface area increases an adhesive strength.*

*26. A method of forming a via plug in a semiconductor device comprising:*

*providing a substrate;*

*forming a conductive layer overlying said substrate;*

*forming an insulating layer overlying said conductive layer, wherein said insulating layer comprises a first insulating layer overlying said conductive layer and a second insulating layer overlying said first insulating layer;*

*forming a via structure in said insulating layer, which exposes a portion of said conductive layer;*

*forming metal nuclei and a plurality of grooves adjacent to said metal nuclei on said conductive layer within said exposed portion of said conductive layer to increase surface area of said conductive layer; and*

*forming a plug layer overlying said exposed portion in said via structure.*

*27. The method of claim 26, further comprising pretreating said exposed portion of said conductive layer by an etching method.*

*28. The method of claim 26, wherein said plurality of grooves are formed by a process including wet etching.*

*29. The method of claim 26, wherein said metal nuclei are formed by a process including deposition.*

*30. The method of claim 26, wherein said first insulating layer is over and in contact with said conductive layer and said second insulating layer is over and in contact with said first insulating layer.*

*31. The method of claim 26, wherein said metal nuclei comprise material selected from a group consisting of tungsten, aluminum, copper, molybdenum, titanium, cobalt, and chromium.*

*32. The method of claim 26, wherein each of said metal nuclei has a magnitude of 500 to 1,000 Å.*

*33. The method of claim 26, wherein said plurality of grooves is formed by a process including etching.*

*34. The method of claim 26, wherein said increased surface area reduces a via resistance.*

*35. The method of claim 26, wherein said increased surface area increases an adhesive strength.*

*36. The method of claim 26, wherein said insulating layer further comprises a third insulating layer over said second insulating layer.*

*37. A method of forming a via plug in a semiconductor device comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming metal nuclei and a plurality of grooves adjacent to said metal nuclei on said conductive layer within said exposed portion of said conductive layer to increase surface area of said conductive layer, wherein said plurality of grooves is formed by etching; and*

*forming a plug layer overlying said exposed portion in said via structure.*

*38. The method of claim 37, further comprising pretreating said exposed portion of said conductive layer by a process including etching.*

*39. The method of claim 37, wherein said plurality of grooves are formed by a process including wet etching.*

*40. The method of claim 37, wherein said metal nuclei are formed by a process including deposition.*

*41. The method of claim 37, wherein said insulating layer comprises a first insulating layer over said conductive layer and a second insulating layer over said first insulating layer.*

*42. The method of claim 37, wherein said insulating layer comprises a first insulating layer over said conductive layer, a second insulating layer over said first insulating layer, and a third insulating layer over said second insulating layer.*

*43. The method of claim 37, wherein said insulating layer is planarized.*

*44. The method of claim 37, wherein said metal nuclei comprises material selected from a group consisting of tungsten, aluminum, copper, molybdenum, titanium, cobalt, and chromium.*

*45. The method of claim 37, wherein each of said metal nuclei has a magnitude of 500 to 1,000 Å.*

*46. The method of claim 37, wherein said increased surface area reduces a via resistance.*

*47. The method of claim 37, wherein said increased surface area increases an adhesive strength.*

*48. A method of forming a plug layer in a semiconductor device comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming conductive nuclei and a plurality of grooves adjacent to said conductive nuclei on said conductive layer within said exposed portion of said conductive layer to increase surface area of said conductive layer, wherein said plurality of grooves is formed by a buffered oxide etching process; and*

*forming a plug layer overlying said exposed portion in said via structure.*

*49. The method of claim 48, further comprising pretreating said exposed portion of said conductive layer by a process including etching.*

*50. The method of claim 48, wherein said conductive nuclei are formed by a process including deposition.*

*51. The method of claim 48, wherein said insulating layer comprises a first insulating layer overlying said conductive layer and a second insulating layer overlying said first insulating layer.*

*52. The method of claim 48, wherein said insulating layer is planarized.*

*53. The method of claim 48, wherein said conductive nuclei comprise material selected from a group consisting of tungsten, aluminum, copper, molybdenum, titanium, cobalt, and chromium.*

*54. The method of claim 48, wherein each of said conductive nuclei has a magnitude of 500 to 1,000 Å.*

*55. The method of claim 48, wherein said increased surface area reduces a via resistance.*

*56. The method of claim 48, wherein said increased surface area increases an adhesive strength.*

*57. The method of claim 48, wherein said insulating layer comprises a first insulating layer over said conductive layer, a second insulating layer over said first insulating layer, and a third insulating layer over said second insulating layer.*

*58. The method of claim 57, wherein said third insulating layer is planarized.*

*59. A method of forming a plug layer in a semiconductor device comprising:*

*providing a substrate;*

*forming a conductive layer overlying said substrate;*

*forming an insulating layer overlying said conductive layer, wherein said insulating layer comprises a first insulating layer overlying said conductive layer and a second insulating layer overlying said first insulating layer;*

*forming a via structure in said insulating layer, which exposes a portion of said conductive layer;*

*forming conductive nuclei and a plurality of grooves adjacent to said conductive nuclei on said conductive layer within said exposed portion of said conductive layer to increase surface area of said conductive layer; and*

*forming a plug layer overlying said exposed portion in said via structure.*

*60. The method of claim 59, further comprising pretreating said exposed portion of said conductive layer by a process including etching.*

*61. The method of claim 59, wherein said plurality of grooves are formed by a process including wet etching.*

*62. The method of claim 59, wherein said conductive nuclei are formed by a process including deposition.*

*63. The method of claim 59, wherein said first insulating layer is over and in contact with said conductive layer and said second insulating layer is over and in contact with said first insulating layer.*

*64. The method of claim 59, wherein said conductive nuclei comprise material selected from a group consisting of tungsten, aluminum, copper, molybdenum, titanium, cobalt, and chromium.*

*65. The method of claim 59, wherein each of said conductive nuclei has a magnitude of 500 to 1,000 Å.*

*66. The method of claim 59, wherein said plurality of grooves is formed by a process including etching.*

*67. The method of claim 59, wherein said increased surface area reduces a via resistance.*

*68. The method of claim 59, wherein said increased surface area increases an adhesive strength.*

*69. The method of claim 59, wherein said insulating layer further comprises a third insulating layer over said second insulating layer.*

*70. A method of forming a plug layer in a semiconductor device comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming conductive nuclei and a plurality of grooves adjacent to said conductive nuclei on said conductive layer within said exposed portion of said conductive layer to increase surface area of said conductive layer, wherein said plurality of grooves is formed by etching; and*

*forming a plug layer overlying said exposed portion in said via structure.*

*71. The method of claim 70, further comprising pretreating said exposed portion of said conductive layer by an etching method.*

*72. The method of claim 70, wherein said plurality of grooves are formed by a wet etching process.*

*73. The method of claim 70, wherein said conductive nuclei are formed by a deposition process.*

*74. The method of claim 70, wherein said insulating layer comprises a first insulating layer overlying said conductive layer and a second insulating layer overlying said first insulating layer.*

*75. The method of claim 70, wherein said insulating layer comprises a first insulating layer overlying said conductive layer, a second insulating layer overlying said first insulating layer, and a third insulating layer overlying said second insulating layer.*

*76. The method of claim 70, wherein said insulating layer is planarized.*

*77. The method of claim 70, wherein said conductive nuclei comprise material selected from a group consisting of tungsten, aluminum, copper, molybdenum, titanium, cobalt, and chromium.*

*78. The method of claim 70, wherein each of said conductive nuclei has a magnitude of 500 to 1,000 Å.*

*79. The method of claim 70, wherein said increased surface area reduces a via resistance.*

*80. The method of claim 70, wherein said increased surface area increases an adhesive strength.*

*81. A method of forming a plug layer in a semiconductor device, comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming nuclei and a plurality of grooves adjacent to said nuclei on said conductive layer within said exposed portion of said conductive layer to increase surface area of said conductive layer, wherein said plurality of grooves is formed by a buffered oxide etching process; and*

*forming a plug layer overlying said exposed portion in said via structure.*

*82. The method of claim 81, further comprising pretreating said exposed portion of said conductive layer by a process including etching.*

*83. The method of claim 81, wherein said nuclei are formed by a process including deposition.*

*84. The method of claim 81, wherein said insulating layer comprises a first insulating layer overlying said conductive layer and a second insulating layer overlying said first insulating layer.*

*85. The method of claim 81, wherein said insulating layer is planarized.*

*86. The method of claim 81, wherein said nuclei comprise material selected from a group consisting of tungsten, aluminum, copper, molybdenum, titanium, cobalt, and chromium.*

*87. The method of claim 81, wherein each of said nuclei has a magnitude of 500 to 1,000 Å.*

*88. The method of claim 81, wherein said increased surface area reduces a via resistance.*

*89. The method of claim 81, wherein said increased surface area increases an adhesive strength.*

*90. The method of claim 81, wherein said insulating layer comprises a first insulating layer over said conductive layer, a second insulating layer over said first insulating layer, and a third insulating layer over said second insulating layer.*

*91. The method of claim 90, wherein said third insulating layer is planarized.*

*92. A method of forming a plug layer in a semiconductor device, comprising:*

*providing a substrate;*

*forming a conductive layer overlying said substrate;*

*forming an insulating layer overlying said conductive layer, wherein said insulating layer comprises a first insulating layer overlying said conductive layer and a second insulating layer overlying said first insulating layer;*

*forming a via structure in said insulating layer, which exposes a portion of said conductive layer;*

*forming nuclei and a plurality of grooves adjacent to said nuclei on said conductive layer within said exposed portion of said conductive layer to increase surface area of said conductive layer; and*

*forming a plug layer overlying said exposed portion in said via structure.*

*93. The method of claim 92, further comprising pretreating said exposed portion of said conductive layer by an etching method.*

*94. The method of claim 92, wherein said plurality of grooves are formed by a process including wet etching.*

*95. The method of claim 92, wherein said nuclei are formed by a process including deposition.*

*96. The method of claim 92, wherein said first insulating layer is over and in contact with said conductive layer and said second insulating layer is over and in contact with said first insulating layer.*

*97. The method of claim 92, wherein said nuclei comprise material selected from a group consisting of tungsten, aluminum, copper, molybdenum, titanium, cobalt, and chromium.*

*98. The method of claim 92, wherein each of said nuclei has a magnitude of 500 to 1,000 Å.*

*99. The method of claim 92, wherein said plurality of grooves is formed by a process including etching.*

*100. The method of claim 92, wherein said increased surface area reduces a via resistance.*

*101. The method of claim 92, wherein said increased surface area increases an adhesive strength.*

*102. The method of claim 92, wherein said insulating layer further comprises a third insulating layer overlying said second insulating layer.*

*103. A method of forming a plug layer in a semiconductor device, comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming nuclei and a plurality of grooves adjacent to said nuclei on said conductive layer within said exposed portion of said conductive layer to increase surface area of said conductive layer, wherein said plurality of grooves is formed by etching; and*

*forming a plug layer overlying said exposed portion in said via structure.*

*104. The method of claim 103, further comprising pretreating said exposed portion of said conductive layer by a process including etching.*

*105. The method of claim 103, wherein said plurality of grooves are formed by a process including wet etching.*

*106. The method of claim 103, wherein said nuclei are formed by a process including deposition.*

*107. The method of claim 103, wherein said insulating layer comprises a first insulating layer overlying said conductive layer and a second insulating layer overlying said first insulating layer.*

*108. The method of claim 103, wherein said insulating layer comprises a first insulating layer overlying said conductive layer, a second insulating layer overlying said first insulating layer, and a third insulating layer overlying said second insulating layer.*

*109. The method of claim 103, wherein said insulating layer is planarized.*

*110. The method of claim 103, wherein said nuclei comprise material selected from a group consisting of tungsten, aluminum, copper, molybdenum, titanium, cobalt, and chromium.*

*111. The method of claim 103, wherein each of said nuclei has a magnitude of 500 to 1,000 Å.*

*112. The method of claim 103, wherein said increased surface area reduces a via resistance.*

*113. The method of claim 103, wherein said increased surface area increases an adhesive strength.*

*114. A method of forming a semiconductor device comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming a plurality of grooves on said conductive layer within said exposed portion of said conductive layer to increase surface area of said conductive layer, wherein said plurality of grooves is formed by a buffered oxide etching process; and*

*forming a plug layer overlying said exposed portion in said via structure.*

*115. The method of claim 114, further comprising pretreating said exposed portion of said conductive layer by a process including etching.*

*116. The method of claim 114, wherein said insulating layer comprises a first insulating layer overlying said conductive layer and a second insulating layer overlying said first insulating layer.*

*117. The method of claim 114, wherein said insulating layer is planarized.*

*118. The method of claim 114, wherein said increased surface area reduces a via resistance.*

*119. The method of claim 114, wherein said increased surface area increases an adhesive strength.*

*120. The method of claim 114, wherein said insulating layer comprises a first insulating layer over said conductive layer, a second insulating layer over said first insulating layer, and a third insulating layer over said second insulating layer.*

*121. The method of claim 120, wherein said third insulating layer is planarized.*

*122. A method of forming a semiconductor device comprising:*

*providing a substrate;*

*forming a conductive layer overlying said substrate;*

*forming an insulating layer overlying said conductive layer, wherein said insulating layer comprises a first insulating layer overlying said conductive layer and a second insulating layer overlying said first insulating layer;*

*forming a via structure in said insulating layer, which exposes a portion of said conductive layer;*

*forming a plurality of grooves on said conductive layer within said exposed portion of said conductive layer to increase surface area of said conductive layer; and*

*forming a plug layer overlying said exposed portion in said via structure.*

*123. The method of claim 122, further comprising pretreating said exposed portion of said conductive layer by a process including etching.*

*124. The method of claim 122, wherein said plurality of grooves are formed by a process including wet etching.*

*125. The method of claim 122, wherein said first insulating layer is over and in contact with said conductive layer and said second insulating layer is over and in contact with said first insulating layer.*

*126. The method of claim 122, wherein said plurality of grooves is formed by a process including etching.*

*127. The method of claim 122, wherein said increased surface area reduces a via resistance.*

*128. The method of claim 122, wherein said increased surface area increases an adhesive strength.*

*129. The method of claim 122, wherein said insulating layer further comprises a third insulating layer over said second insulating layer.*

*130. A method of forming a semiconductor device comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming a plurality of grooves on said conductive layer within said exposed portion of said conductive layer to increase surface area of said conductive layer, wherein said plurality of grooves is formed by etching; and*

*forming a plug layer overlying said exposed portion in said via structure.*

*131. The method of claim 130, further comprising pretreating said exposed portion of said conductive layer by a process including etching.*

*132. The method of claim 130, wherein said plurality of grooves are formed by a process including wet etching.*

*133. The method of claim 130, wherein said insulating layer comprises a first insulating layer overlying said con-*

*ductive layer and a second insulating layer overlying said first insulating layer.*

*134. The method of claim 130, wherein said insulating layer is planarized.*

*135. The method of claim 130, wherein said increased surface area reduces a via resistance.*

*136. The method of claim 130, wherein said increased surface area increases an adhesive strength.*

*137. The method of claim 130, wherein said insulating layer comprises a first insulating layer over said conductive layer, a second insulating layer over said first insulating layer, and a third insulating layer over said second insulating layer.*

*138. A method of forming a semiconductor device comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming a plurality of grooves on said conductive layer within said exposed portion of said conductive layer to increase adhesive strength of said conductive layer, wherein said plurality of grooves is formed by a buffered oxide etching process; and*

*forming a plug layer overlying said exposed portion in said via structure.*

*139. The method of claim 138, comprising pretreating said exposed portion of said conductive layer by a process including etching.*

*140. The method of claim 138, wherein said insulating layer comprises a first insulating layer overlying said conductive layer and a second insulating layer overlying said first insulating layer.*

*141. The method of claim 138, wherein said insulating layer comprises a first insulating layer overlying said conductive layer, a second insulating layer overlying said first insulating layer, and a third insulating layer overlying said second insulating layer.*

*142. The method of claim 138, wherein said insulating layer is planarized.*

*143. The method of claim 138, wherein said increased adhesive strength reduces a via resistance.*

*144. The method of claim 138, wherein said insulating layer comprises a first insulating layer overlying and in contact with said conductive layer, a second insulating layer overlying and in contact with said first insulating layer, and a third insulating layer overlying said second insulating layer.*

*145. The method of claim 144, wherein said third insulating layer is planarized.*

*146. A method of forming a semiconductor device comprising:*

*providing a substrate;*

*forming a conductive layer overlying said substrate;*

*forming an insulating layer overlying said conductive layer, wherein said insulating layer comprises a first insulating layer overlying said conductive layer and a second insulating layer overlying said first insulating layer;*

*forming a via structure in said insulating layer, which exposes a portion of said conductive layer;*

*forming a plurality of grooves on said conductive layer within said exposed portion of said conductive layer to increase adhesive strength of said conductive layer; and*

*forming a plug layer overlying said exposed portion in said via structure.*

*147. The method of claim 146, further comprising pretreating said exposed portion of said conductive layer by a process including etching.*

*148. The method of claim 146, wherein said plurality of grooves are formed by a process including wet etching.*

*149. The method of claim 146, wherein said first insulating layer is over said conductive layer and said second insulating layer is over said first insulating layer.*

*150. The method of claim 146, wherein said plurality of grooves is formed by a process including etching.*

*151. The method of claim 146, wherein said increased adhesive strength reduces a via resistance.*

*152. The method of claim 146, wherein said insulating layer further comprises a third insulating layer over said second insulating layer.*

*153. A method of forming a semiconductor device comprising:*

*providing a substrate;*

*forming a conductive layer overlying said substrate;*

*forming an insulating layer overlying said conductive layer;*

*forming a via structure in said insulating layer, which exposes a portion of said conductive layer;*

*forming a plurality of grooves on said conductive layer within said exposed portion of said conductive layer to increase adhesive strength of said conductive layer, wherein said plurality of grooves is formed by etching; and*

*forming a plug layer overlying said exposed portion in said via structure.*

*154. The method of claim 153, further comprising pretreating said exposed portion of said conductive layer by a process including etching.*

*155. The method of claim 153, wherein said plurality of grooves are formed by a process including wet etching.*

*156. The method of claim 153, wherein said insulating layer comprises a first insulating layer overlying said conductive layer and a second insulating layer overlying said first insulating layer.*

*157. The method of claim 153, wherein said insulating layer comprises a first insulating layer overlying said conductive layer, a second insulating layer overlying said first insulating layer, and a third insulating layer overlying said second insulating layer.*

*158. The method of claim 153, wherein said insulating layer is planarized.*

*159. The method of claim 153, wherein said increased adhesive strength reduces a via resistance.*

* * * * *

UNITED STATES PATENT AND TRADEMARK OFFICE

CERTIFICATE OF CORRECTION

PATENT NO. : RE. 36,475
DATED : December 28, 1999
INVENTOR(S) : Choi

It is certified that error appears in the above-identified patent and that said Letters Patent is hereby corrected as shown below:

Column 1,
Line 8, insert the following:

-- Notice: More than one reissue application has been filed for the reissue of patent 5,409,861. The reissue applications are 08/734,784 (the present application), and 09/293,207, all of which are continuation reissue applications of Patent No. 5,409,861. --

Signed and Sealed this

Thirtieth Day of September, 2003

JAMES E. ROGAN
*Director of the United States Patent and Trademark Office*